(12) United States Patent
Stephens et al.

(10) Patent No.: US 10,181,420 B2
(45) Date of Patent: Jan. 15, 2019

(54) DEVICES WITH CHAMFER-LESS VIAS MULTI-PATTERNING AND METHODS FOR FORMING CHAMFER-LESS VIAS

(71) Applicant: GLOBALFOUNDRIES Inc., Grand Cayman (KY)

(72) Inventors: Jason Eugene Stephens, Menands, NY (US); David Michael Permana, Ballston Spa, NY (US); Guillaume Bouche, Albany, NY (US); Andy Wei, Kanta (CA); Mark Zaleski, Galway, NY (US); Anbu Selvam K M Mahalingam, Mechanicville, NY (US); Craig Michael Child, Jr., Gansevoort, NY (US); Roderick Alan Augur, Saratoga Springs, NY (US); Shyam Pal, Clifton Park, NY (US); Linus Jang, Clifton Park, NY (US); Xiang Hu, Clifton Park, NY (US); Akshey Sehgal, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/425,478

(22) Filed: Feb. 6, 2017

(65) Prior Publication Data

US 2018/0226294 A1 Aug. 9, 2018

(51) Int. Cl.
| | |
|---|---|
| H01L 21/768 | (2006.01) |
| H01L 21/311 | (2006.01) |
| H01L 21/027 | (2006.01) |
| H01L 23/522 | (2006.01) |
| H01L 23/528 | (2006.01) |

(52) U.S. Cl.
CPC .... *H01L 21/76897* (2013.01); *H01L 21/0273* (2013.01); *H01L 21/31144* (2013.01); *H01L 21/7684* (2013.01); *H01L 21/76802* (2013.01); *H01L 21/76843* (2013.01); *H01L 21/76877* (2013.01); *H01L 23/528* (2013.01); *H01L 23/5226* (2013.01)

(58) Field of Classification Search
None
See application file for complete search history.

(56) References Cited

U.S. PATENT DOCUMENTS

| 8,916,472 | B2* | 12/2014 | Hu | H01L 21/76811 |
| | | | | 438/428 |
| 9,059,257 | B2* | 6/2015 | Li | H01L 21/76897 |
| 9,613,862 | B2* | 4/2017 | Lenhardt | H01L 21/76897 |
| 9,793,164 | B2* | 10/2017 | Machkaoutsan | ............ |
| | | | | H01L 21/76808 |
| 2014/0038412 | A1* | 2/2014 | Hu | H01L 21/76811 |
| | | | | 438/689 |

(Continued)

*Primary Examiner* — Abul Kalam
(74) *Attorney, Agent, or Firm* — Heslin Rothenberg Farley & Mesiti P.C.; Jacquelyn A. Graff (57) ABSTRACT

Semiconductor devices and methods of fabricating the semiconductor devices with chamfer-less via multi-patterning are disclosed. One method includes, for instance: obtaining an intermediate semiconductor device; performing a trench etch into a portion of the intermediate semiconductor device to form a trench pattern; depositing an etching stack; performing at least one via patterning process; and forming at least one via opening into a portion of the intermediate semiconductor device. An intermediate semiconductor device is also disclosed.

10 Claims, 9 Drawing Sheets

(56) References Cited

U.S. PATENT DOCUMENTS

| | | | |
|---|---|---|---|
| 2015/0091181 A1* | 4/2015 | Li | H01L 21/76897 257/774 |
| 2015/0171010 A1* | 6/2015 | Bristol | H01L 23/522 257/774 |
| 2015/0214094 A1* | 7/2015 | Jezewski | H01L 21/7688 438/618 |
| 2016/0155701 A1* | 6/2016 | Mignot | H01L 23/5226 257/751 |
| 2017/0062275 A1* | 3/2017 | Lenhardt | H01L 21/76897 |
| 2017/0140986 A1* | 5/2017 | Machkaoutsan | H01L 21/76808 |

* cited by examiner

DEVICES WITH CHAMFER-LESS VIAS MULTI-PATTERNING AND METHODS FOR FORMING CHAMFER-LESS VIAS

FIELD OF THE INVENTION

The present invention relates to semiconductor devices, methods of fabricating semiconductor devices, and methods of forming devices with denser via patterns and lower capacitance, and more particularly, to methods and devices for forming chamfer-less via multi-patterning.

BACKGROUND OF THE INVENTION

As semiconductors continue to decrease in size, the separation of the vias continues to decrease. As the vias move closer together the chamfering at the top may be positioned too close to adjacent vias. If the tops of the vias are positioned too close together the capacitance may increase. There is also a risk of breaking minimum critical dimension rules for the dielectric isolation between the chamfered line and the associated line at the level below belonging to a separate net. Thus, new devices and methods for decreasing via chamfering to allow the back end of line (BEOL) capacitance to stay as low as possible are needed.

SUMMARY OF THE INVENTION

The shortcomings of the prior art are overcome and additional advantages are provided through the provision, in one aspect, a method includes, for instance: obtaining an intermediate semiconductor device; performing a trench etch into a portion of the intermediate semiconductor device to form a trench pattern; depositing an etching stack; performing at least one via patterning process; and forming at least one via opening into a portion of the intermediate semiconductor device.

In another aspect, an intermediate semiconductor device is provided which includes, for instance: a substrate; a first etch stop layer on the substrate; a second etch stop layer on the first etch stop layer; a low k layer on the second etch stop layer; a first dielectric layer on the low k layer; a hardmask layer on the dielectric layer; a protective mask layer deposited on the hardmask layer, and wherein a portion of the protective mask layer extends into trench openings in the hardmask layer, the dielectric layer, and a portion of the low k layer; and a third etch stop layer on the protective mask layer.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain semiconductor devices, for example, field-effect transistors (FETs), which provide advantages over the above noted, existing semiconductor devices and fabrication processes. Advantageously, the semiconductor device fabrication processes disclosed herein provide for devices formed with chamferless vias.

Figure 1:
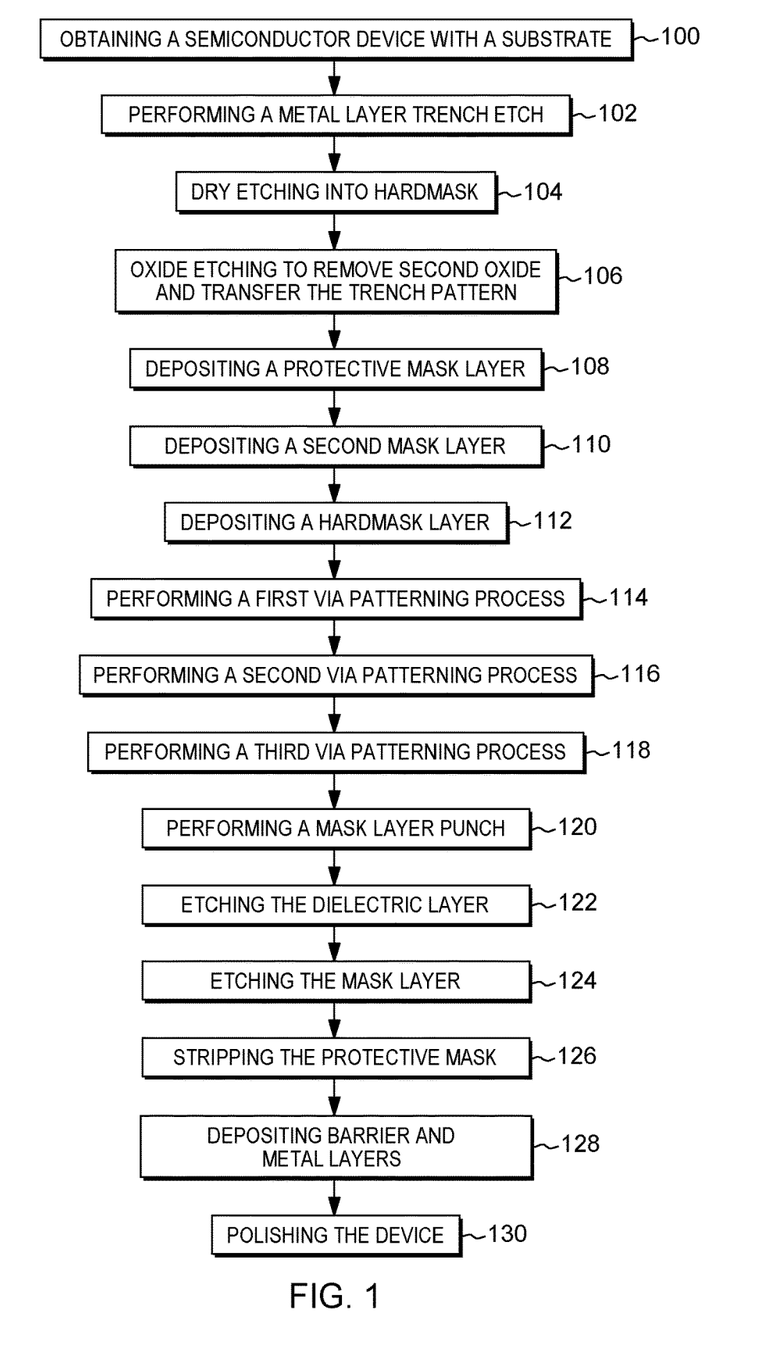
FIG. 1 depicts one embodiment of a method for a patterning process which may be used during semiconductor processing, in accordance with one or more aspects of the present invention.

In one aspect, as shown in FIG. 1, a via formation process which may be used during semiconductor processing is shown. The via formation process in accordance with one or more aspects of the present invention may include, for instance: obtaining a semiconductor device with a substrate 100; performing a metal layer trench etch 102; dry etching into a hardmask 104; oxide etching to remove a second oxide and transfer the trench pattern 106; depositing a protective mask layer 108; depositing a second mask layer 110; depositing a hardmask layer 112; performing a first via patterning process 114; performing a second via patterning process 116; performing at least one third via patterning process 118; performing a mask layer punch 120; etching the dielectric layer 122; etching the mask layer 124; stripping the protective mask layer 126; depositing a barrier layer and metal layer 128; and polishing the device 130.

FIGS. 2-17 depict, by way of example only, a detailed embodiment of a portion of a semiconductor device formation process of FIG. 1 and an intermediate semiconductor device 200, in accordance with one or more aspects of the present invention. Note again that these figures are not drawn to scale in order to facilitate understanding of the invention, and that the same reference numerals used throughout different figures designate the same or similar elements.

Figure 2:
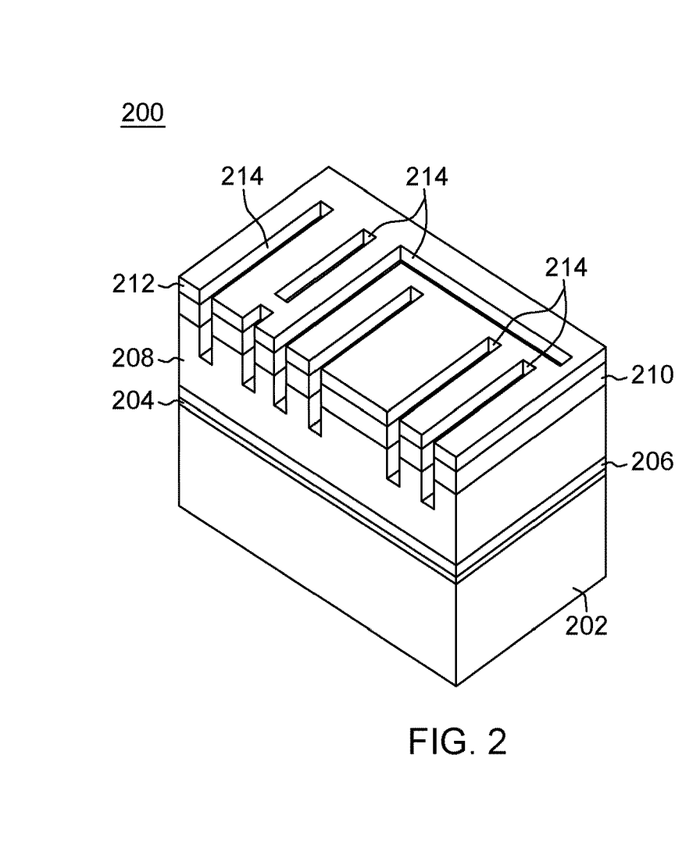
FIG. 2 depicts a three-dimensional view of one embodiment of a portion of an intermediate semiconductor device after front end of line (FEOL) processing, middle of line (MOL) processing, and trench patterning, in accordance with one or more aspects of the present invention.

One detailed embodiment of a portion of the semiconductor device formation process of FIG. 1 is depicted, by way of example only, in FIGS. 2-17. FIG. 2 shows a portion of a semiconductor device 200 obtained during the fabrication process. The device 200 may include, for example, a substrate 202. The substrate 202 may in some embodiments have or be a substantially crystalline substrate material (i.e., bulk silicon), whereas in other embodiments, the substrate 202 may be formed on the basis of a silicon-on-insulator (SOI) architecture or any known substrate, such as, glass, gallium nitride (GaN), gallium arsenide (AsGa), silicon carbide (SiC) or the like.

The device 200 may be processed through initial processing steps in accordance with the design of the device 200 being fabricated. For example, the device 200 may be processed through FEOL and MOL processing and may include gates, fins, sources, drains, and the like, not shown. As shown in FIG. 2, the device 200 may also include a first etch stop layer 204, such as, an aluminum nitride (AlN) layer or a like material which forms an etch stop layer. The device 200 may further include a second etch stop layer 206, such as, an oxygen doped carbide (ODC) layer or a like material which forms an etch stop layer. A low k layer 208 may be deposited over the second etch stop layer 206 of the device 200. The device 200 may also include a first dielectric layer 210, such as, a silicon dioxide ($SiO_2$) layer or a like dielectric material, deposited over the low k layer 208. The device 200 may further include a hardmask layer 212, such as, a titanium dioxide ($TiO_2$) layer or a like hardmask layer. The device 200 may also include a second dielectric layer (not shown) deposited on the hardmask layer 212. The second dielectric layer (not shown) may be, for example, $SiO_2$ or a like material.

Although not shown, the second dielectric layer may be patterned for the trench etch process. Once the second dielectric layer (not shown) is patterned, a hardmask layer 212 punch may be performed to transfer the trench pattern onto the hardmask layer 212. The punch may be, for example, a reactive ion etch process. Then, an etch may be performed to remove the portions of the dielectric layer 210 and low k layer 208 positioned below the patterned portions of the device 200, as shown in FIG. 2. The etch process may be, for example, a three part etch process. The etching process may include, for example, a dry etch into the hardmask layer 212. The etching process may also include, for example, an oxide etch to remove the second oxide layer (not shown) and transfer the trench pattern onto the first dielectric layer 210 and the low k layer 208 to form at least one trench pattern opening 214. The etching process may be performed at any metal layer, such as, the M1 layer or any subsequent level.

Figure 3:
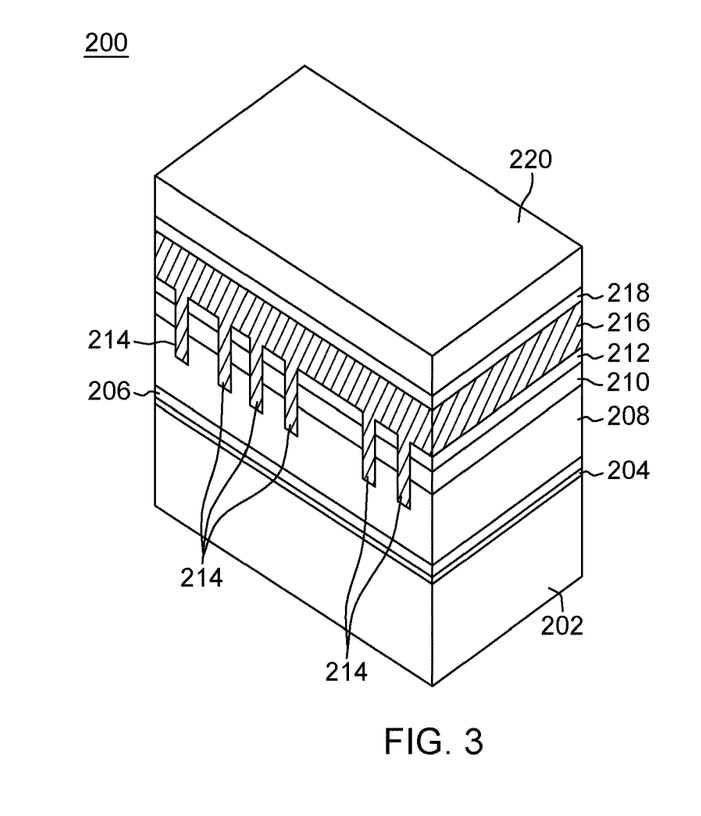
FIG. 3 depicts the three-dimensional view of the portion of the intermediate semiconductor device of FIG. 2 after depositing a protective mask layer, an etch stop layer, and a hardmask over the device, in accordance with one or more aspects of the present invention.

Next, as shown in FIG. 3, a protective mask layer 216 may be deposited over the device 200 to fill the trench pattern openings 214. The protective mask layer 216 may be, for example, an organic planarization layer (OPL) such as a siloxane-based material, which is commercially available from Honeywell International, Inc., Tempe, Ariz., under the name DUO™ This layer 216 may have a thickness of, for example, approximately 30 to 70 nanometers, more preferably approximately 50 nanometers, and the like to form a barrier or protective layer during trench patterning. The layer 216 may be deposited using a variety of techniques, including spin-on deposition. In one embodiment, the protective mask layer 216 may be a material that is susceptible to, for example, a dry reactive ion etching (RIE) in a manner similar to, for example, silicon dioxide or silicon nitride.

A third etch stop layer 218 may then be deposited over the protective mask layer 216, as shown in FIG. 3. The third etch stop layer 218 may be, for example, an AlN or like material which forms an etch stop layer. The third etch stop layer 218 may be, for example, deposited by physical vapor deposition (PVD) and like deposition methods as known by one of skill in the art. A hardmask 220, for example, iMASK™, may then optionally be deposited over the third etch stop layer 218. The iMASK™ is a material developed and commercially available from Applied Materials, Inc., of Santa Clara, Calif. The hardmask 220 may be, for example, a bottom anti-reflective coating (BARC) like memorization layer or the like. The hardmask 220 may be deposited by, for example, PVD or another known deposition method. Alternatively, the hardmask 220 may be, for example, a SiON dielectric with a composition that has been adjusted in terms of n and k to function appropriately as an anti-reflective coating, and also as a memorization layer for multi-patterning.

Figure 4:
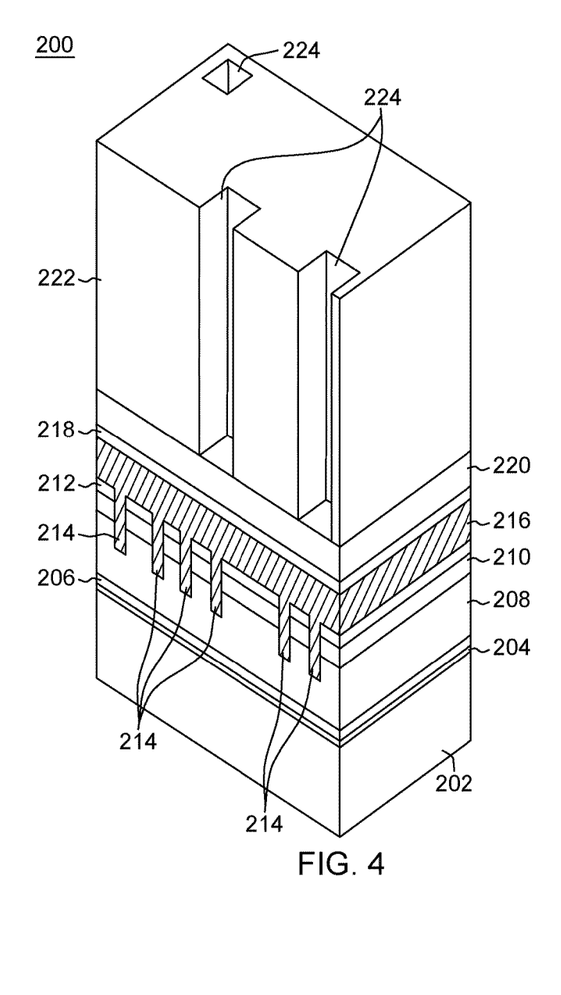
FIG. 4 depicts the three-dimensional view of the portion of the intermediate semiconductor device of FIG. 3 after depositing a first photoresist layer and performing a first lithography to form at least one first via opening, in accordance with one or more aspects of the present invention.
Figure 5:
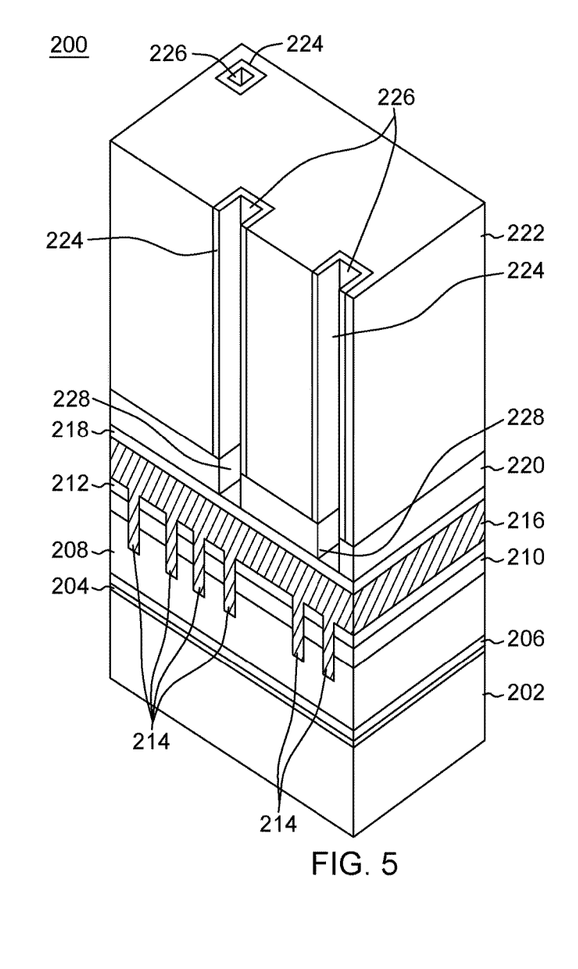
FIG. 5 depicts a three-dimensional view of the intermediate semiconductor device of FIG. 4 after depositing a first spacer material to form spacers within the at least one first via opening and etching into the hardmask, in accordance with one or more aspects of the present invention.
Figure 6:
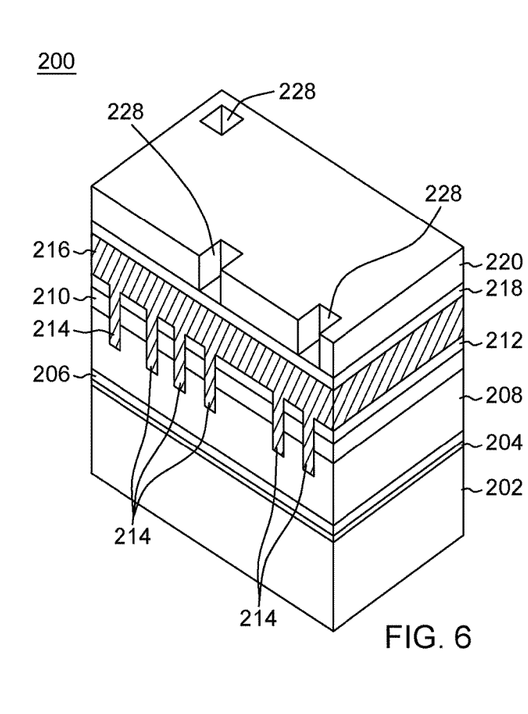
FIG. 6 depicts the three-dimensional view of the intermediate semiconductor device of FIG. 5 after stripping the photoresist layer, in accordance with one or more aspects of the present invention.

Next, as shown in FIG. 4, a first patterning process may be performed. The first patterning process may include depositing a first photoresist layer 222 over the device 200. Lithography may then be performed exposing the first photoresist layer 222 to form at least one first via opening 224. After the at least one first opening 224 is formed, a spacer material may be conformally deposited over the device and into the at least one first opening 224. The spacer material may be, for example, an amorphous carbon film and if used the sacrificial spacer along with the resist is removed during the resist strip process. A vertical etch may then be performed to form at least one first spacer 226 in each of the at least one first openings 224. Referring now to FIG. 5, the hardmask 220 may then be etched to form at least one first hardmask opening 228. The at least one first hardmask opening 228 may be positioned directly below the openings positioned within the at least one first spacer 226. Thus, the at least one first hardmask opening 228 may be smaller than the at least one first opening 224. Finally, the first photoresist layer 222 and the spacer material may be stripped from the device 200, as shown in FIG. 6. The first photoresist layer 222 and the spacer material may be stripped by, for example, an O$_2$ Ash process.

Figure 7:
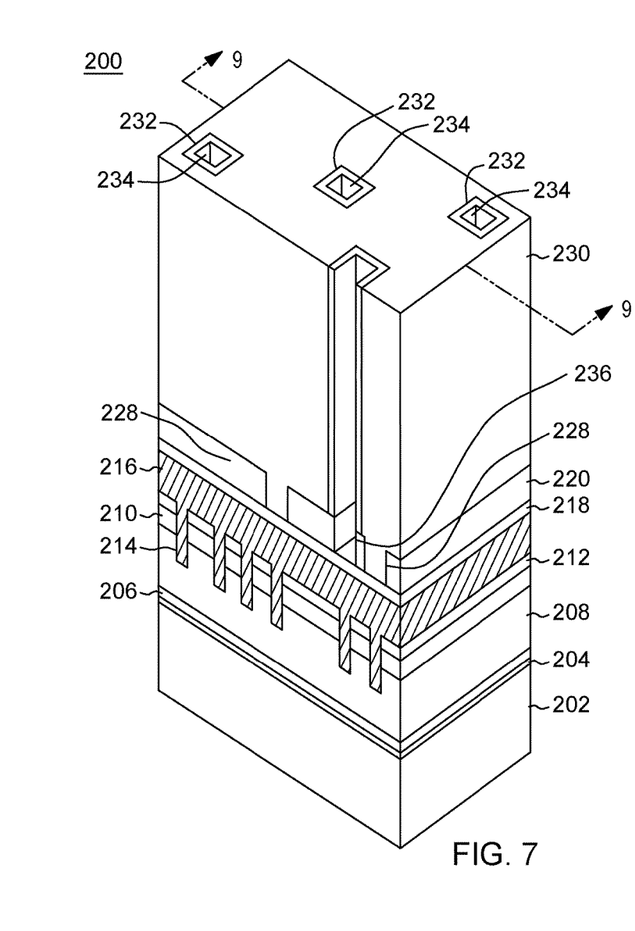
FIG. 7 depicts the three-dimensional view of the intermediate semiconductor device of FIG. 6 after depositing a second photoresist layer, performing a second lithography to form at least one second via opening, depositing a second spacer material to form spacers within the at least one second via opening and etching into the hardmask, in accordance with one or more aspects of the present invention.
Figure 8:
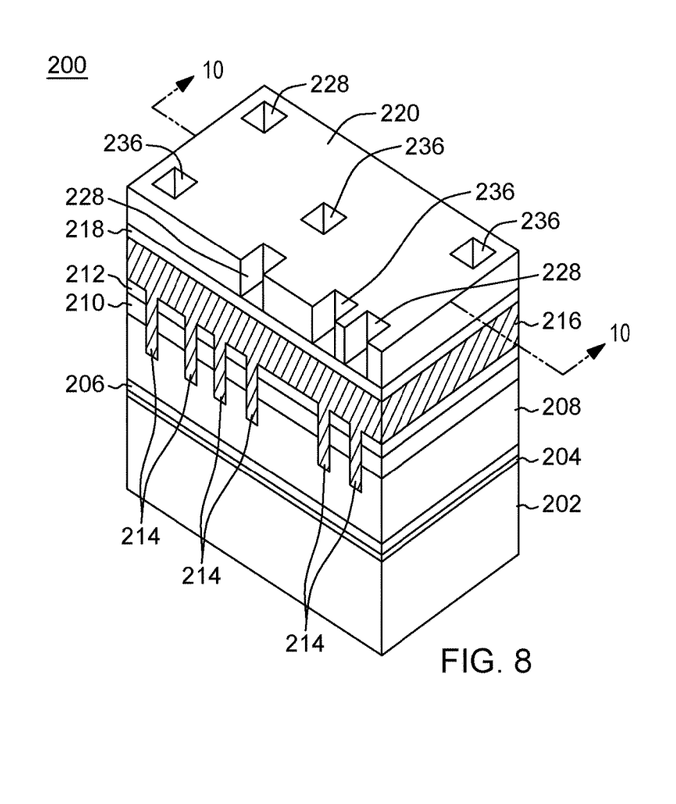
FIG. 8 depicts the three-dimensional view of the intermediate semiconductor device of FIG. 7 after stripping the photoresist layer, in accordance with one or more aspects of the present invention.

Referring now to FIGS. 7 and 8, a second patterning process may be performed. The second patterning process may include depositing a second photoresist layer 230 over the device 200. The second photoresist layer 230 may fill the at least one first hardmask opening 228. Lithography may then be performed exposing the second photoresist layer 230 to form at least one second via opening 232. After the at least one second opening 232 is formed, a spacer material may be conformally deposited over the device and into the at least one second opening 232. A vertical etch may then be performed to form at least one second spacer 234 in each of the at least one second openings 232. The hardmask 220 may then be etched to form at least one second hardmask opening 236. The at least one second hardmask opening 236 may be positioned directly below the openings positioned within the at least one second spacer 234. Thus, the at least one second hardmask opening 236 may be smaller than the at least one second opening 232. Finally, the second photoresist layer 230 may be stripped from the device 200 along with the second spacer 234, for example, by an Ash process, as shown in FIG. 8.

Figure 9:
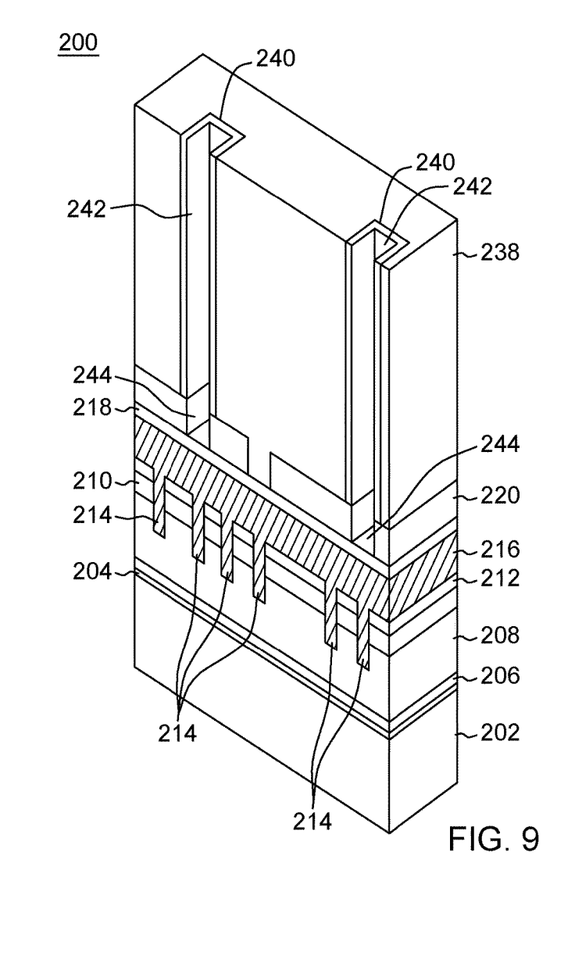
FIG. 9 depicts a portion of the three-dimensional view of the intermediate semiconductor device of FIG. 7 taken along line 9-9 after depositing a third photoresist layer, performing a third lithography to form at least one third via opening, depositing a third spacer material to form spacers within the at least one third via opening and etching into the hardmask, in accordance with one or more aspects of the present invention.
Figure 10:
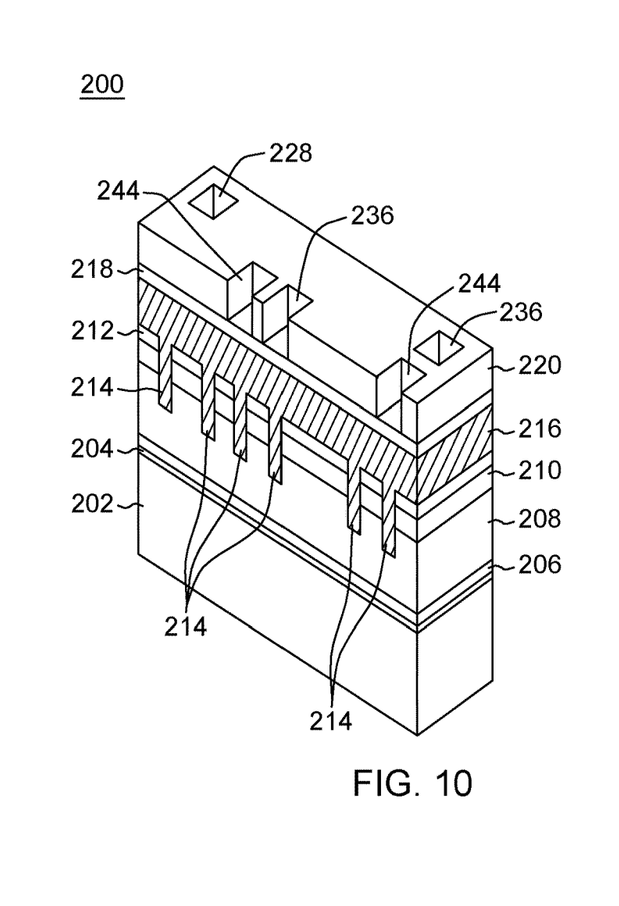
FIG. 10 depicts the portion of the three-dimensional view of the intermediate semiconductor device of FIG. 8 taken along line 10-10 after the processing of FIG. 9 and stripping the photoresist layer, in accordance with one or more aspects of the present invention.

Referring now to FIGS. 9 and 10, a third patterning process may be performed. The third patterning process may include depositing a third photoresist layer 238 over the device 200. The third photoresist layer 238 may fill the at least one first hardmask opening 228 and the at least one second hardmask opening 236. Lithography may then be performed exposing the third photoresist layer 238 to form at least one third via opening 240. After the at least one third opening 240 is formed, a spacer material may be conformally deposited over the device and into the at least one third opening 240. A vertical etch may then be performed to form at least one third spacer 242 in each of the at least one third openings 240. The hardmask 220 may then be etched to form at least one third hardmask opening 244. The at least one third hardmask opening 244 may be positioned directly below the openings positioned within the at least one third spacer 242. Thus, the at least one third hardmask opening 244 may be smaller than the at least one third opening 240. Finally, the third photoresist layer 238 and the third spacer 242 may be stripped from the device 200, as shown in FIG. 10.

Figure 11:
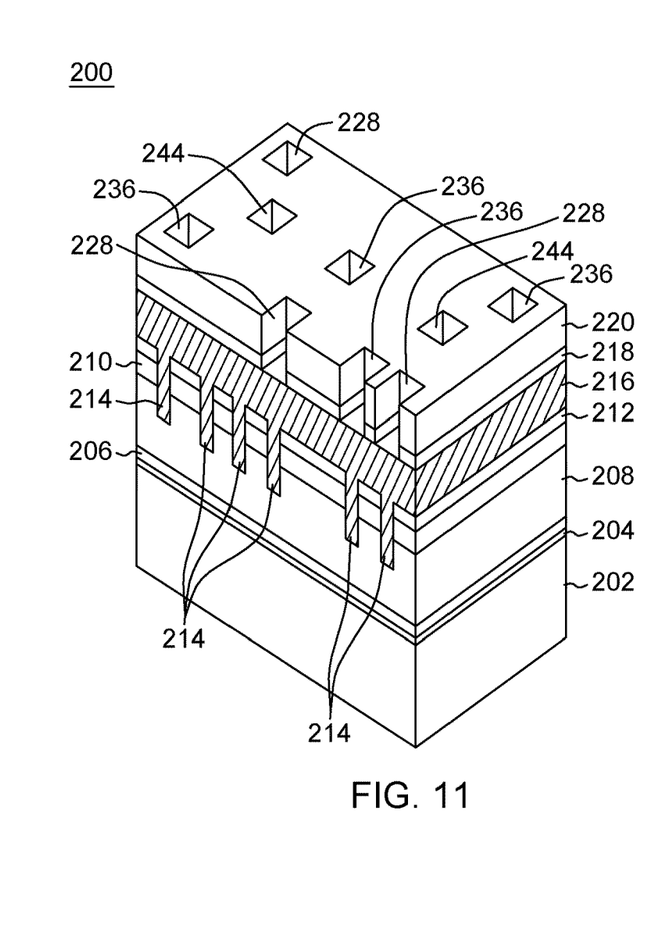
FIG. 11 depicts the three-dimensional view of the intermediate semiconductor device of FIG. 8 after the processing of FIGS. 9 and 10 and after performing a mask layer punch, in accordance with one or more aspects of the present invention.
Figure 12:
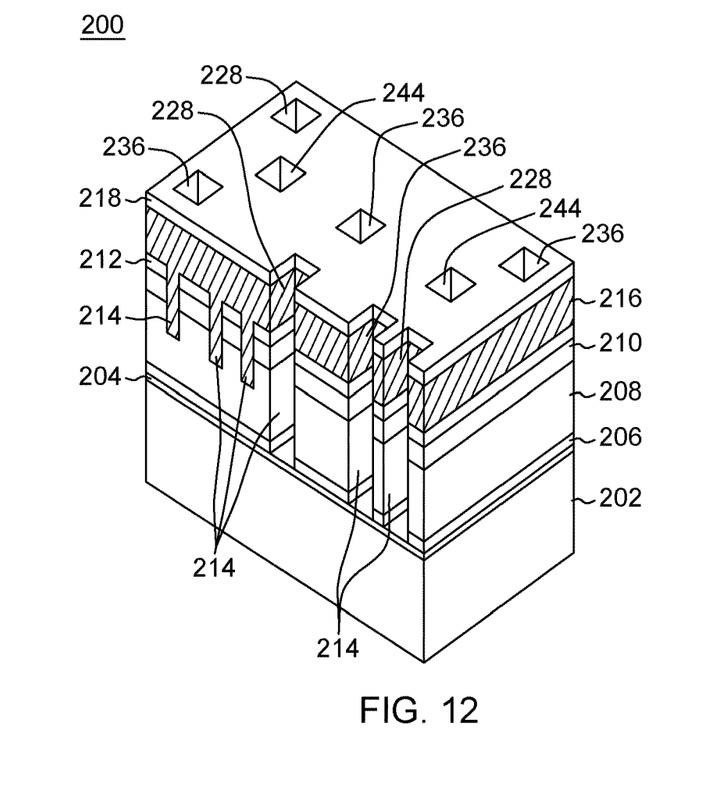
FIG. 12 depicts the three-dimensional view of the intermediate semiconductor device of FIG. 10 after etching the protective mask layer, the hardmask layer, the dielectric layer, the low k layer, and the second etch stop layer, in accordance with one or more aspects of the present invention.
Figure 13:
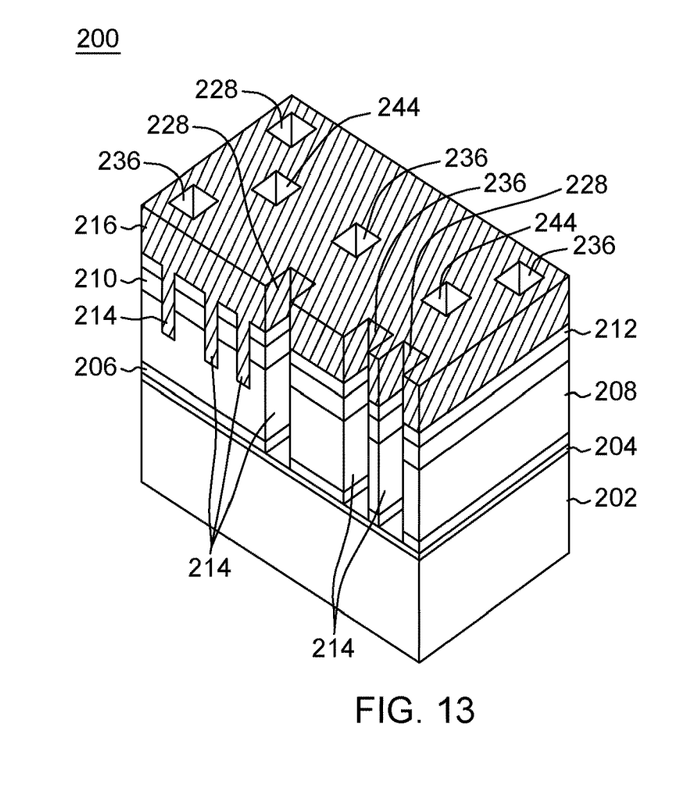
FIG. 13 depicts the three-dimensional view of the intermediate semiconductor device of FIG. 12 after etching the first etch stop layer and consuming the third etch stop layer, in accordance with one or more aspects of the present invention.
Figure 14:
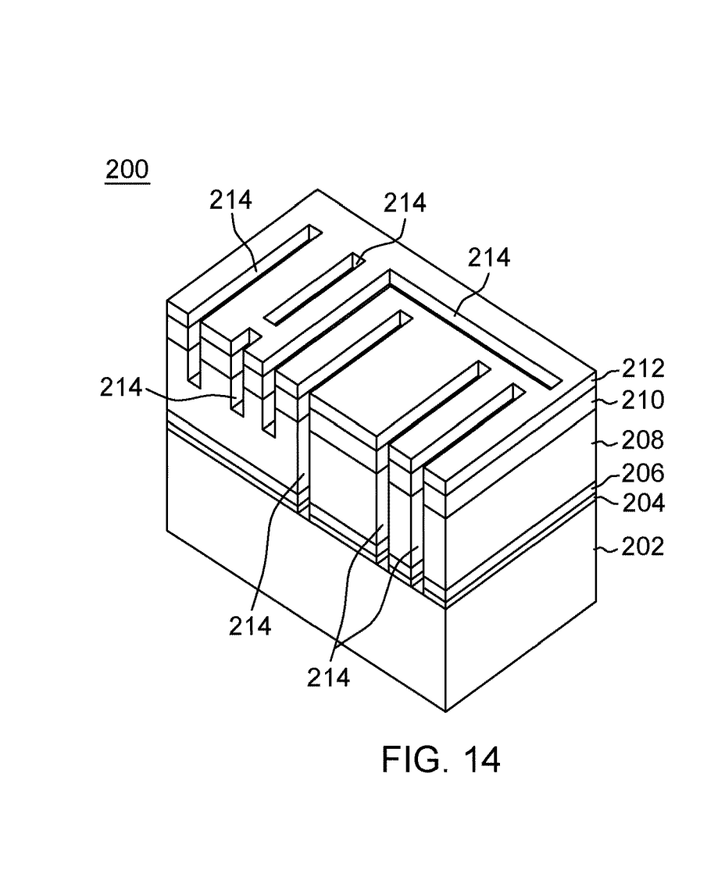
FIG. 14 depicts the three-dimensional view of the intermediate semiconductor device of FIG. 13 after stripping the protective mask layer, in accordance with one or more aspects of the present invention.

As shown in FIG. 11, a short Reactive Ion etch or punch may be performed through the third etch stop layer 218 to transfer the trench pattern and expose a portion of the protective mask layer 216. Next, as shown in FIG. 12, an etch may be performed to etch through the protective mask layer 216, then, and through the existing openings into the hardmask layer 212 and/or the dielectric layer 210, the low k layer 208, and the second etch stop layer 206. The etch may be, for example, a dielectric etch or the like to etch through the materials of the protective mask layer 216, the hardmask layer 212, the dielectric layer 210, the low k layer 208, and the second etch stop layer 206. The first etch stop layer 204 may act as an etch stop for the dielectric etch. In addition, the hardmask 212 acts as a block to allow the via transfer to be self-aligned within the trench openings 214 initially patterned as shown in FIG. 12. For example, the via openings 228, 236, 244 may be formed self-aligned with the trench openings 214, such that when etching is performed the via openings 228, 236, 244 will be etched through the trench openings 214, as shown in FIGS. 12-14. During etching, the hardmask 220 may be consumed as shown in FIG. 12. Another etch may then be performed to etch the first etch stop layer 204, as shown in FIG. 13. The etch through the first etch stop layer 204 exposes the underlying metal layer, for example, a line or a contact or like metal in the preceding layer.

Figure 15:
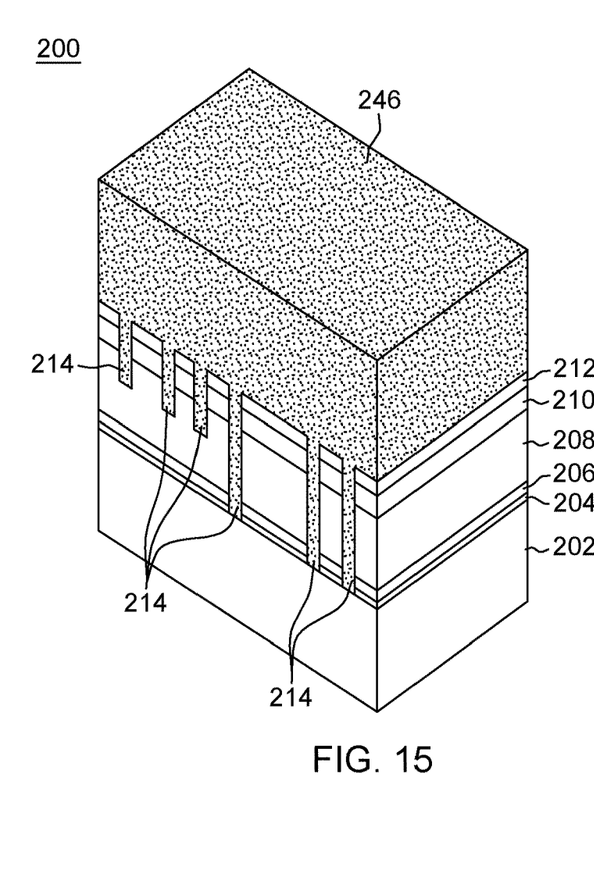
FIG. 15 depicts the three-dimensional view of the intermediate semiconductor device of FIG. 14 after depositing barrier and metal layers in the trench pattern openings, in accordance with one or more aspects of the present invention.
Figure 16:
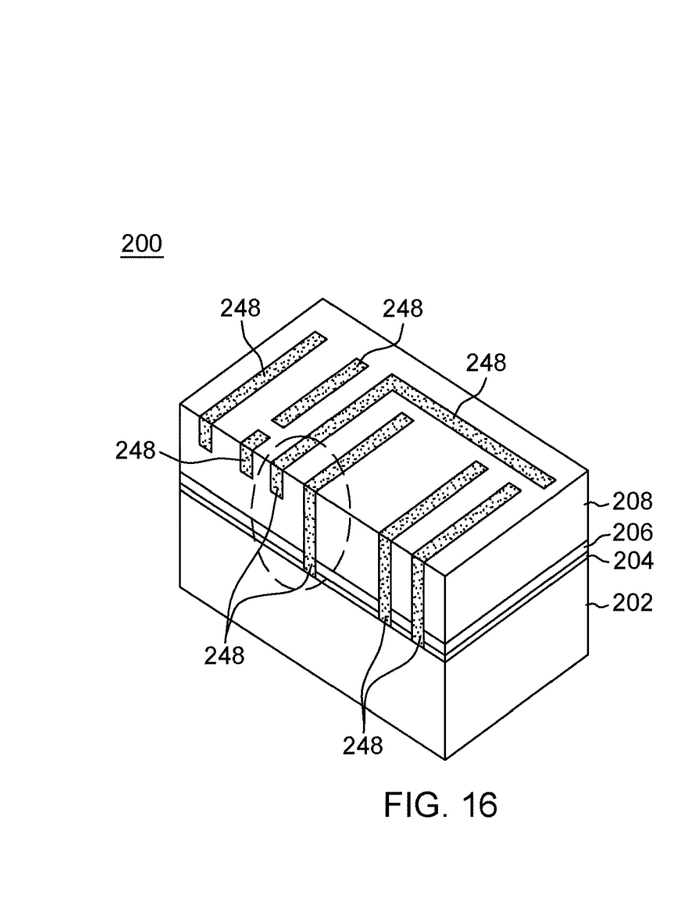
FIG. 16 depicts the three-dimensional view of the intermediate semiconductor device of FIG. 15 after polishing to remove the excess barrier and metal materials to form trenches and vias, in accordance with one or more aspects of the present invention.
Figure 17:
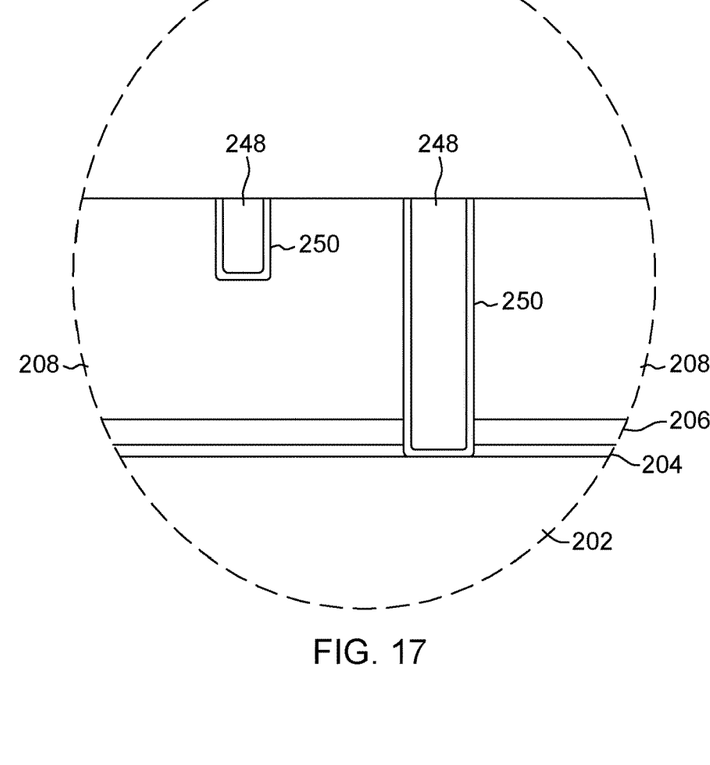
FIG. 17 depicts a cross-sectional view of a portion of the intermediate semiconductor device of FIG. 16, in accordance with one or more aspects of the present invention.

After the etching is complete, the protective mask layer 216 may be stripped to expose the trench openings 214, as shown in FIG. 14. The protective mask layer 216 may be stripped with, for example, an organic removal process, such as, an O$_2$ Ash. Next, as shown in FIG. 15, a barrier layer 250 (see FIG. 17) and a metal layer 246 may be deposited over the device 200 to fill the trench openings 214. After the barrier and metal layers 246 are deposited, the device 200 may be polished to remove the excess barrier and metal layers 246 and form the trenches and vias 248, as shown in FIG. 16. In addition, as shown in FIG. 16, the polishing may remove the dielectric layer 210 and hardmask layer 212 and may erode the low k layer 208. As shown in FIG. 17, the trenches and vias 248 do not have chamfered edges.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   obtaining an intermediate semiconductor device;
   performing a trench etch into a portion of the intermediate semiconductor device to form a trench pattern;
   depositing an etching stack over the intermediate semiconductor device, wherein the etch stack comprises:
      a protective mask layer over the intermediate semiconductor device;
      a via etch stop layer over the protective mask layer; and
      a hardmask over the via etch stop layer;
   performing at least one via patterning process to the intermediate semiconductor device, wherein performing at least one via patterning process comprises:
      coating the hardmask with a first photoresist layer;
      performing lithography to pattern at least one first via opening;
      forming a first spacer within the at least one first via opening;
      etching the at least one first via opening into the hardmask to form at least one first hardmask opening smaller than the at least one first via opening; and
      removing the first photoresist layer; and
   transferring the at least one first hardmask opening into a portion of the intermediate semiconductor device, wherein the at least one first hardmask opening is self-aligned with at least a portion of the trench pattern.

2. The method of claim 1, wherein the intermediate semiconductor device comprises:
   a substrate;
   a first substrate etch stop layer on the substrate;
   a second substrate etch stop layer on the first substrate etch stop layer;
   a low k layer on the second substrate etch stop layer;
   a first dielectric layer on the low k layer;
   a hardmask layer on the first dielectric layer; and
   a second dielectric layer on the hardmask layer.

3. The method of claim 2, further comprising:
   performing a punch through the via etch stop layer in the at least one first hardmask opening to expose a portion of the protective mask layer;
   etching through the protective mask layer, the hardmask layer on the first dielectric layer, the first dielectric layer, the low k layer, and the second substrate etch stop layer; and
   etching through the first substrate etch stop layer.

4. The method of claim 2, wherein performing the trench etch into the portion of the intermediate semiconductor device comprises:
   etching into the hardmask layer;
   performing an etch to transfer the trench pattern into the first dielectric layer and remove the second dielectric layer; and
   etching into the low k layer to form at least one trench pattern opening.

5. The method of claim 4, further comprising:
   depositing a barrier layer into the at least one trench pattern opening and the at least one first hardmask opening;
   performing a metal deposition process for the at least one trench pattern opening and the at least one first hardmask opening; and
   polishing the intermediate semiconductor device to form metal filled trenches and vias.

6. The method of claim 5, wherein the metal filled trenches and vias comprises:
   a top edge;
   a bottom surface; and
   walls extending up from the bottom surface to the top edge;
   wherein the walls do not have chamfered top edges.

7. The method of claim 1, wherein performing at least one via patterning process further comprises:
   performing at least one second via patterning process.

8. The method of claim 7, wherein performing at least one second via patterning process comprises:
   coating intermediate semiconductor device with a second photoresist layer, wherein the second photoresist layer fills the at least one first hardmask opening;
   performing lithography to pattern at least one second via opening;
   forming a second spacer within the at least one second via opening;
   etching the at least one second via opening into the hardmask to form at least one second hardmask opening smaller than the at least one second via opening; and
   removing the second photoresist layer.

9. The method of claim 8, wherein performing at least one via patterning process comprises:
   performing at least one third via patterning process.

10. The method of claim 9, wherein the performing at least one third via patterning process comprises:
    coating intermediate semiconductor device with a third photoresist layer, wherein the third photoresist layer fills the at least one second hardmask opening;
    performing lithography to pattern at least one third via opening;
    forming a third spacer within the at least one third via opening;
    etching the at least one third via opening into the hardmask to form at least one third hardmask opening smaller than the at least one third via opening; and
    removing the third photoresist layer.

* * * * *